United States Patent [19]

Yamazaki et al.

[11] Patent Number: 5,254,141
[45] Date of Patent: Oct. 19, 1993

[54] INDUSTRIAL DIAMOND COATING AND METHOD OF MANUFACTURING THE SAME

[75] Inventors: Shunpei Yamazaki, Tokyo; Masaya Kadono, Kanagawa, both of Japan

[73] Assignee: Semiconductor Energy Laboratory Co., Ltd., Kanagawa, Japan

[21] Appl. No.: 704,104

[22] Filed: May 22, 1991

[30] Foreign Application Priority Data

May 30, 1990 [JP] Japan ................... 2-140226

[51] Int. Cl.$^5$ .............................. B32B 9/00
[52] U.S. Cl. ......................... 51/295; 51/298; 428/408
[58] Field of Search .......... 51/293, 295, 298; 423/446; 428/408; 427/249; 156/230, 247

[56] References Cited

U.S. PATENT DOCUMENTS

| | | | |
|---|---|---|---|
| 3,942,959 | 3/1976 | Marköö ................... | 51/295 |
| 4,101,698 | 7/1978 | Dunning et al. ......... | 428/31 |
| 4,179,324 | 12/1979 | Kirkpatrick ............ | 156/230 |
| 4,776,862 | 10/1988 | Weand .................... | 51/293 |
| 4,919,974 | 4/1990 | McCune et al. ......... | 51/293 |
| 4,968,326 | 11/1990 | Weand .................... | 51/293 |
| 5,061,292 | 10/1991 | Chen ...................... | 51/293 |
| 5,082,359 | 1/1992 | Kirkpatrick ............ | 427/45.1 |

FOREIGN PATENT DOCUMENTS

| | | |
|---|---|---|
| 0207467 | 1/1987 | European Pat. Off. |
| 0319926 | 6/1989 | European Pat. Off. |
| 0402671 | 12/1990 | European Pat. Off. |
| 1212767 | 8/1989 | Japan. |

OTHER PUBLICATIONS

"Oxidation of CVD Diamond Films", L. S. Plano et al., 1046b Extended Abstracts, vol. 89/1, No. 105, May 7, 1989, Princeton, N.J., US., p. 153.

Primary Examiner—Mark L. Bell
Assistant Examiner—Deborah Jones
Attorney, Agent, or Firm—Sixbey Friedman Leedom & Ferguson

[57] ABSTRACT

An industrial diamond coating on an object and a method of manufacturing the same are described. A diamond coating is first formed on a substrate other than the object to be coated. The diamond coating is then joined to the object by means of an adhesive. One of features of an industrial diamond coating of the present invention is heat resistance. This feature can be realized by subjecting a diamond coating to etching in order to eliminate carbon in the form other than diamond structure from the coating followed by filling void spaces occurring in the coating after the elimination with a heat resistant material. The substrate may be removed from the diamond film which is already fixed to the object to provide a hard surface for the object.

4 Claims, 7 Drawing Sheets

INDUSTRIAL DIAMOND COATING AND METHOD OF MANUFACTURING THE SAME

BACKGROUND OF THE INVENTION

1. Field of the Invention

The present invention relates to an industrial diamond coating and a method of manufacturing the same.

2. Description of the Prior Art

The life time of machine tools such as cutting tools and grinding tools or other instruments having very hard surfaces or abrasive edges for machining purpose can be prolonged by coating, directly on the hard surfaces or abrasive edges, protection films made of very hard materials such as diamond, titanium carbide, titanium nitride, carbonated titanium nitride, aluminum oxide. Particularly, diamond coating has been believed to be very effective in the cases of coating on surfaces made of nonferrous metals or ceramics.

One of the practical problems of these technique is the coming-off or rubbing-off of the diamond film from the surface of a tool. Until now, there has not been yet accomplished sufficient adhesivity of diamond coatings to the surfaces of tools. The difference in thermal expansion coefficient between the diamond film and the underlying surfaces has been considered as a cause of separation of the diamond films from the surface.

The applicant has proposed an improved method for dealing with the above conventional shortcoming in a Japanese patent application Ser. No. 2-76308 filed on Mar. 26, 1990. FIGS. 1(A) to 1(C) are cross sectional views showing a method of forming a diamond coating in accordance with the invention proposed by the Japanese application. FIG. 1(A) is a diagram showing a cross sectional view of the diamond crystals grown from a substrate 1 in the form of a thin film as designated by numeral 10. As shown in the figure, the crystals are grown in inverted conical shapes. The contact areas of the crystals to the underlying surface of the substrate are very small because of the inversion of the cones, resulting in poor adhesivity. The substrate 1 coated with the diamond film 10 is then joined to the surface of an object 20 to be reinforced by the diamond film by means of a gold solder 11 as shown in FIG. 1(B). Finally, the substrate 1 is eliminated from the diamond film 10 by mechanical grinding as shown in FIG. 1(C).

As easily understood from FIG. 1(C), the contact areas of the diamond crystals 10 and the surface of the object 20 are substantially increased by this procedure so that mechanical strength of the coating structure can be greatly improved, resulting also from the effects of the adhesive. Accordingly, this method is very effective in many applications. On the other hand, some inconveniences, however, have arisen when the above method is applied to devices which produce much frictional heat during machining such as in the cases of some grinding tools. Diamond coating formed on a substrate was rubbing off from the surface of the substrate in those cases.

BRIEF SUMMARY OF THE INVENTION

It is an object of the present invention to provide a diamond coating and a method of manufacturing the same which is hardly separated from the underlying surface.

It is another object of the present invention to provide a diamond coating and a method of manufacturing the same which can be applied for devices whose temperature is elevated during machining due to much frictional heat.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, carbon in the form other than diamond structure is eliminated from the diamond coating followed by filling of void spaces occurring in the coating after the elimination with a heat-resistant material.

The above solution has been culminated from the discovery that the rubbing off of diamond coating is caused from carbon material occurring in the diamond coating but deposited in structures other than diamond structure such as amorphous carbon or graphite which easily comes off from the surface of the object when the temperature rises beyond 300° C. Namely, in accordance with the present invention, the diamond coating consists only of pure diamond crystals with a heat-resistant filling material so that separation of the coating is unlikely even at high temperatures.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Referring now to FIG. 2 and FIGS. 3(A) to 3(E), a method of manufacturing carbon coating in accordance with a first embodiment of the present invention will be explained.

Figure 2:
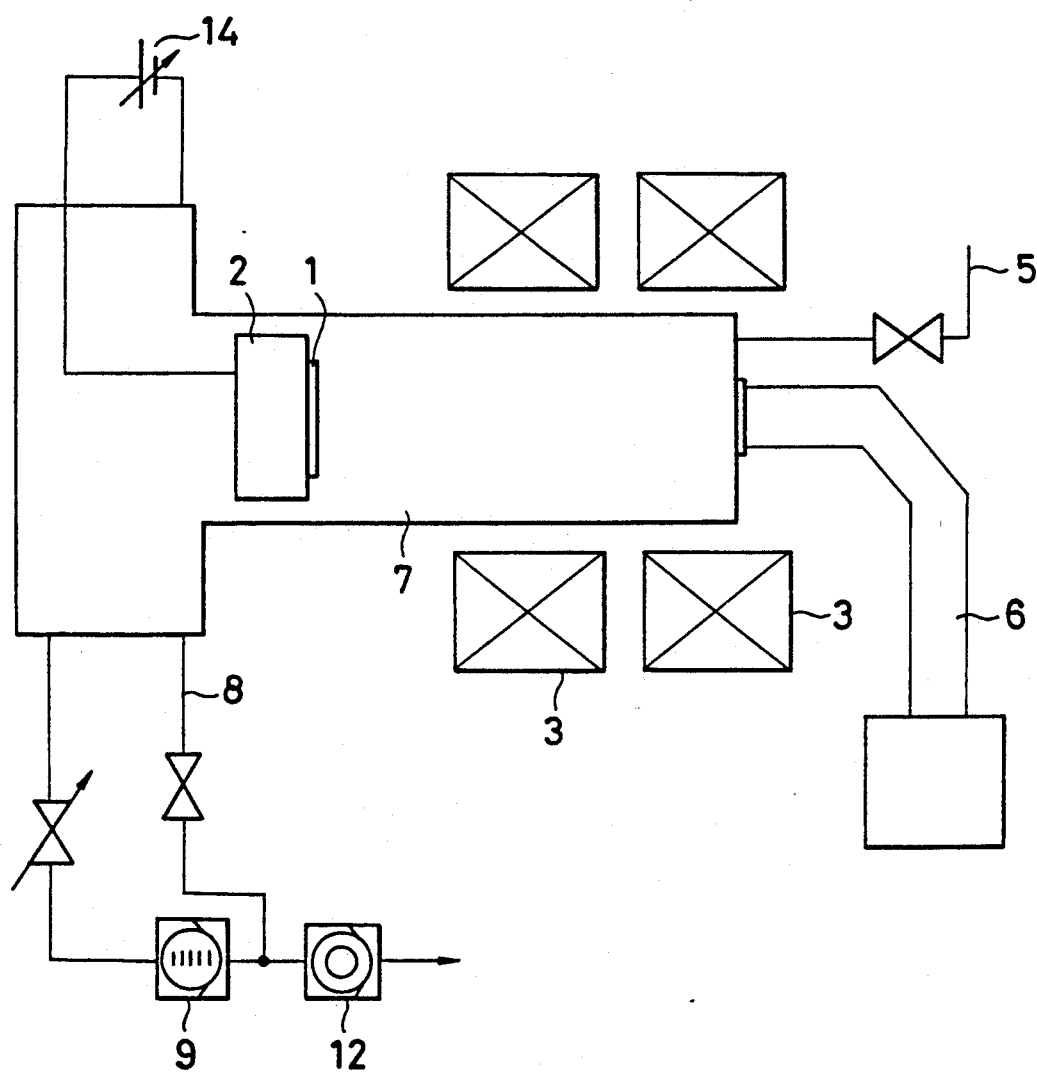
FIG. 2 is a schematic diagram showing a microwave assisted CVD apparatus for explaining a method of forming a diamond coating in accordance with the present invention.

FIG. 2 illustrates a microwave assisted CVD apparatus for carrying out deposition of diamond in a magnetic field. The apparatus comprises a vacuum chamber 7, a holder 2 provided in the chamber 7, a voltage source 4 for applying a suitable bias voltage to the holder 2, a microwave generator 6 coupled with the chamber 7, a gas introduction system 5 for introducing a reactive gas into the chamber 7, Helmholtz coils 3 surrounding the chamber 7 and an evacuation system including a turbo molecular pump 9 and a rotary pump 12 for maintaining the pressure in the chamber at an appropriate level and removing exhausted gas therefrom.

After mounting a silicon semiconductor substrate 1 of 4 inches diameter to be coated on the holder 2 in the chamber 7 and evacuating the chamber 7 by means of the evacuation system, a reactive gas consisting of methanol (50 ccm) and hydrogen (100 ccm) is introduced into the chamber from the gas introduction system 5. The strength of a magnetic field induced by the coils 3 is controlled at a suitable level, e.g. 875 Gauss or higher at the substrate surface. Microwaves (2.45 GHz) are inputted from the generator 6 at 4 KW. The reactive gas is then activated into a high energy plasma and decomposed to grow diamond crystals on the surface of the substrate 1 at a reaction pressure of 0.25 Torr. The temperature of the substrate 1 is kept at 800° C. during the deposition. Accordingly, a 10 $\mu$m thick diamond film is coated on the substrate by deposition continued for 20 hours. The surface of the substrate is given scratches in advance to provide seeds for crystal growth thereon by ultrasonic treatment for 60 minutes in a solution in which diamond particles of 30 $\mu$m to 40 $\mu$m diameter are dispersing.

Figure 3A:
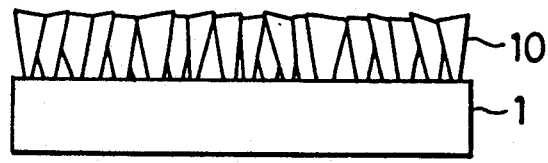
FIGS. 3(A) to 3(E) are cross sectional views showing a method of forming a diamond coating in accordance with a first embodiment of the present invention.

FIG. 3(A) is a diagram showing a cross sectional view of the diamond crystals grown from the substrate 1 in the form of a thin film as designated by numeral 10. As shown in the figure, the crystals are grown in inverted conical shapes. The contact areas of the crystals to the underlying surface of the substrate are very small because of the inversion of the cones, resulting in poor adhesivity.

Figure 3B:
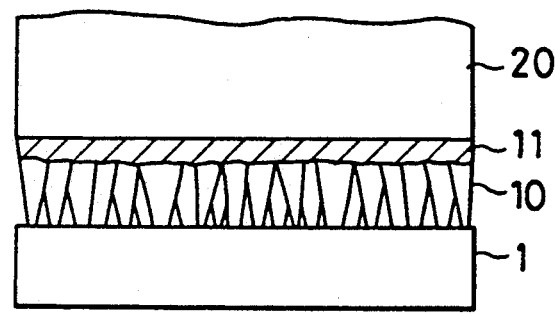

The substrate 1 coated with the diamond film 10 is then removed from the chamber and joined to the surface of an object 20 to be reinforced by the diamond film by means of an adhesive made of polybenzimidazole 11 as shown in FIG. 3(B). The surface of the object is, for example, the abrasive surface of a grinder made of tungsten carbide. Other adhesive can be used in place of the above such as suitable heat-resistant strong adhesives for structural reinforcement, for example, epoxy/phenolic, nitrile/phenolic. The surface of the diamond film 10 may be given, if desired, plasma treatment or sand blast treatment in advance of the joining in order to further enhance the adhesivity thereof to the object 20. The substrate 1 is then eliminated from the diamond film 10 by mechanical grinding as shown in FIG. 3(C).

Figure 3C:
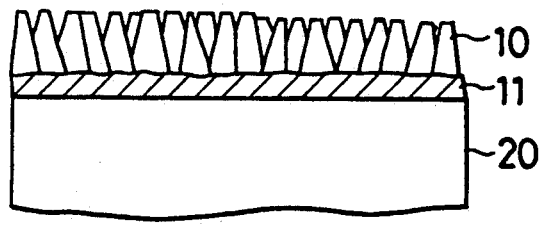
Figure 3D:
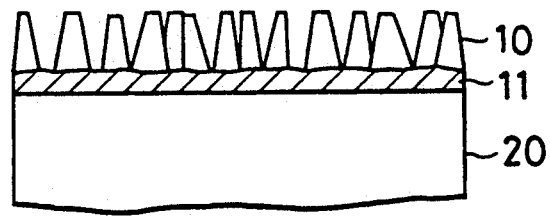
Figure 3E:
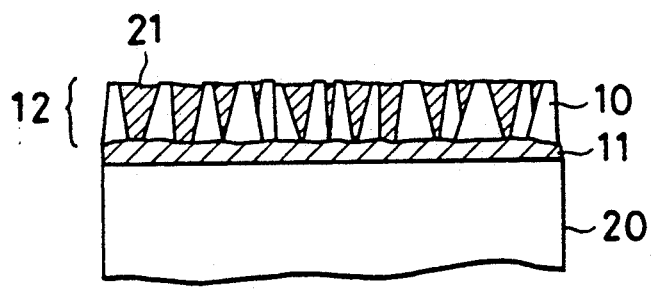

As easily understood from FIG. 3(C), the contact areas of the diamond crystals 10 and the surface of the object 20 are substantially increased by this procedure. The object is disposed again in the apparatus shown in FIG. 2 to carry out plasma etching. The etchant gas is oxygen introduced into the vacuum chamber 7 at 100 SCCM. The reaction pressure of oxygen is kept at 0.10 Torr by means of the evacuation system. The input power of microwave energy (2.45 GHz) is 4 kW. The strength of a magnetic field applied to the object is 875 Gauss or stronger. The etching action is continued for 30 minutes in order to eliminate carbon material such as amorphous carbon and graphite other than diamond from the coating. Then, spaces are left after the elimination in the coating as shown in FIG. 3(D). Finally, the spaces are filled with a heat-resistant adhesive or solder, e.g. polybenzimidazole in order to provide a cohesive protecting coating 12 as shown in FIG. 3(E).

Figure 1A:
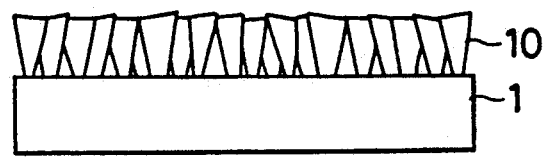
FIGS. 1(A) to 1(C) are cross sectional views showing a method of forming a diamond coating in accordance with a technique previously proposed by the applicant.
Figure 1B:
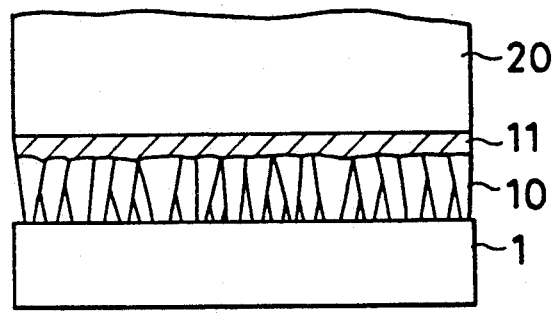
Figure 1C:
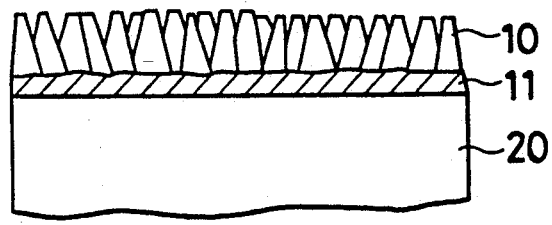
Figure 4:
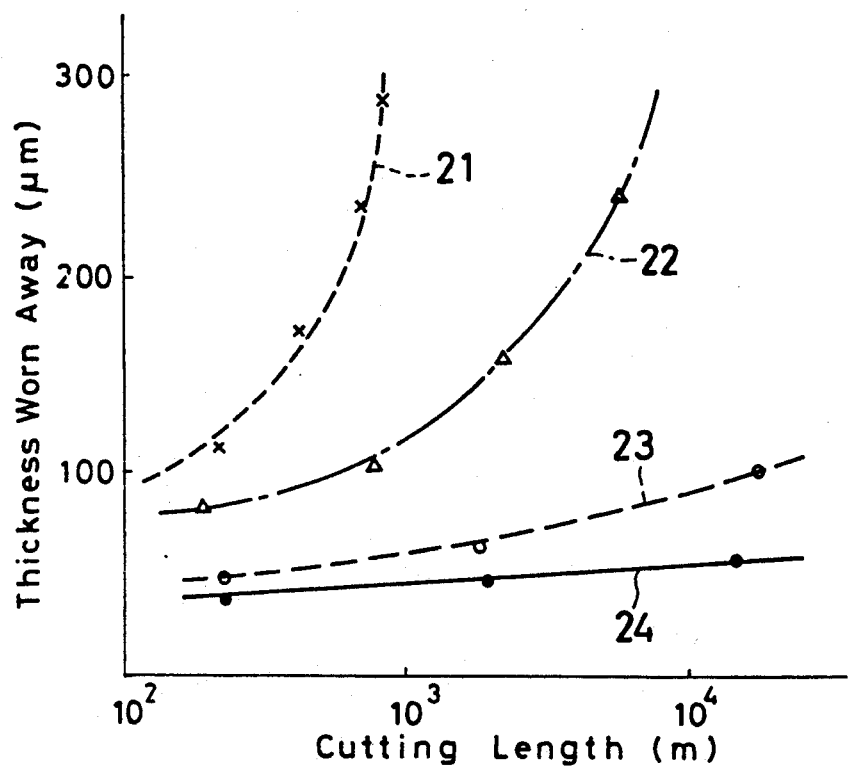
FIGS. 4 and 5 are graphical diagrams showing the advantages of the present invention as compared with the prior art technique.

Experiments have been conducted as a comparison test in order to prove effectiveness of the present invention over prior art techniques. The test was carried out by cutting the peripheral surfaces of aluminum cylinders by means of a lathe whose cutting tool was replaced by sample cutting tools made of tungsten whose edges had been selectively coated or not coated with diamond coating. The cutting speed of the edge turning relative to the peripheral surfaces was 400 m/min. The depth of cutting into the surfaces was 0.25 mm. The feeding speed of the surface to the cutting edges was 0.1 mm/rev. FIG. 4 is a graphical diagram showing the relationship between the length of the cut surface and the thickness of the surface portion of the edge worn away due to the cutting action. Curve 21 represents the relationship in the case that the tool had been coated with no diamond coating. Curve 22 represents the relationship in the case that diamond had been deposited directly on the tool according to a conventional technique. Curve 23 represents the relationship in the case that diamond was first deposited on a substrate and thereafter transferred to the tool as shown in FIGS. 1(A) to 1(C). Curve 24 represents the relationship in the case that diamond was first deposited on a substrate, transferred to the tool, etched and given polybenzimidazole as shown in FIGS. 3(A) to 3(E). As seen from the diagram, it will be understood by comparing curves 23 and 24 with curves 21 and 22 that highly abrasion proof tools could be realized by the use of the cutting edges which were provided with the diamond coating consisting of inverted diamond cones connected to the edges at their wide bottom surfaces.

Figure 6:
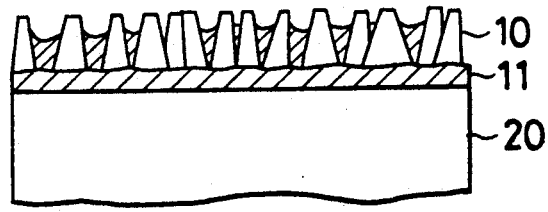
FIG. 6 is a cross sectional view showing a diamond coating in accordance with the present invention after usage for machining.
Figure 5:
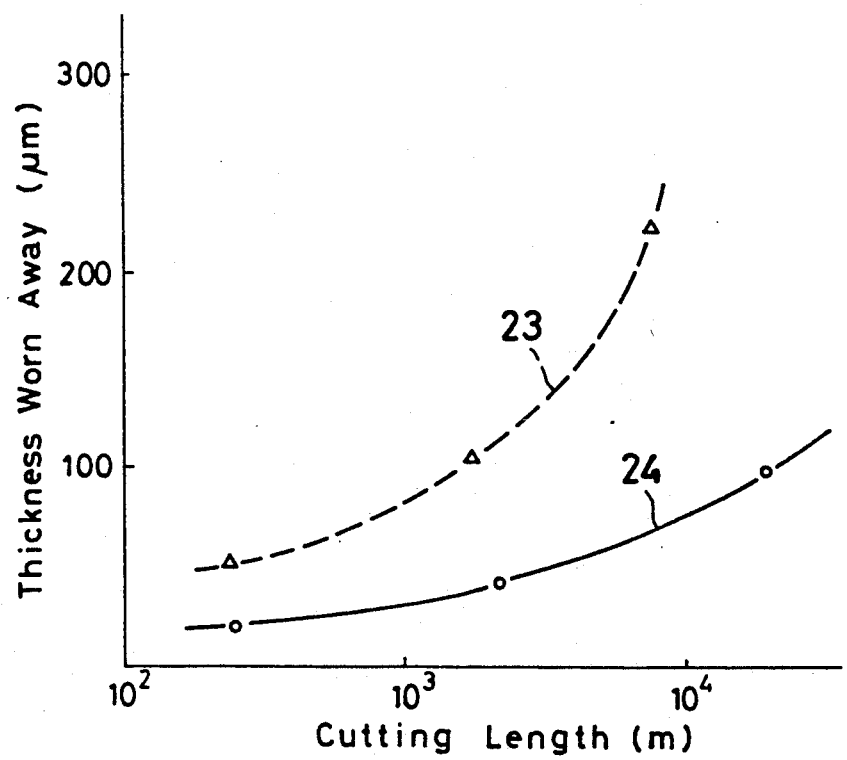

The significant advantage of the present invention appeared when the cutting speed was increased to 1000 m/min so that the temperature of the edge was elevated to about 300° C. FIG. 5 is a graphical diagram showing the relationship corresponding to FIG. 4. Curve 23 represents the relationship in the case that diamond was first deposited on a substrate and thereafter transferred to the tool as shown in FIGS. 1(A) to 1(C). Curve 24 represents the relationship in the case that diamond was first deposited on a substrate, transferred to the tool, etched and given polybenzimidazole as shown in FIGS. 3(A) to 3(E). As seen from the diagram, curve 23 indicates that the diamond coating substantially wore away as the cutting length increased. This is considered because of separation of amorphous carbon or graphite due to the elevated temperature resulting in void spaces between diamond crystals of the coating. Contrary to this, curve 24 indicates heat-resistance of the coating with little wear. This is considered due to the polybenzimidazole filler reinforcing the bases of the constituent diamond cones even after partial removal of the surface portions thereof due to abrasive action during cutting as shown in FIG. 6.

Referring now to FIGS. 7(A) to 7(D), a method of manufacturing carbon coating in accordance with a second embodiment of the present invention will be explained.

Figure 7A:
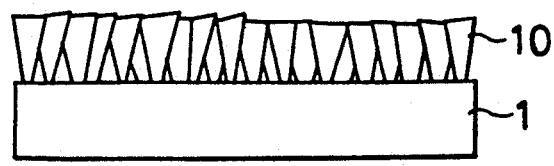
FIGS. 7(A) to 7(D) are cross sectional views showing a method of forming a diamond coating in accordance with a second embodiment of the present invention.
Figure 7B:
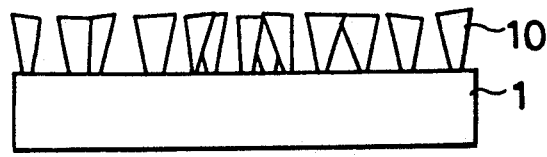

FIG. 7(A) is a diagram showing a cross sectional view of the diamond crystals grown from the substrate 1 in the form of a thin film as designated by numeral 10. The deposition process is done in the same manner as in the first embodiment. The object is next subjected to plasma etching in the same apparatus shown in FIG. 2 by exchanging the reactive gas from the gas for deposition to an etchant gas. Namely, the deposition and the etching can be carried out continuously without moving of the object. The etchant gas is oxygen introduced into the vacuum chamber 7 at 100 SCCM. The reaction pressure of oxygen is kept at 0.10 Torr by means of the evacuation system. The input power of microwave energy (2.45 GHz) is 4 kW. The strength of a magnetic field applied to the object is 875 Gauss or stronger. The etching action is continued for 30 minutes in order to eliminate carbon material such as amorphous carbon and graphite other than diamond from the coating. Then, spaces are left after the elimination in the coating as shown in FIG. 7(B).

Figure 7C:
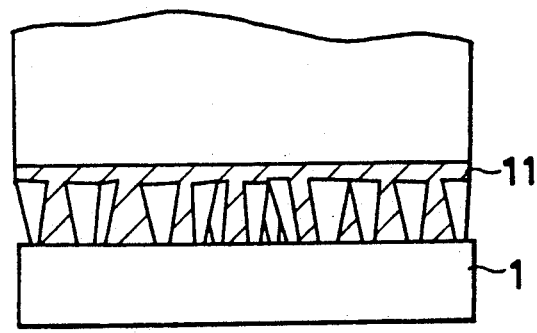

The substrate 1 coated with the diamond film 10 consisting only of pure diamond crystals is then joined to the surface of an object 20 to be reinforced by the diamond film by means of an adhesive made of polybenzimidazole 11 as shown in FIG. 7(C). Other adhesive can be used in place of the above such as suitable heat-resistant strong adhesives for structural reinforcement, for example, epoxy/phenolic, nitrile/phenolic in the same manner as the first embodiment. The substrate 1 is then eliminated from the diamond film 10 by mechanical grinding as shown in FIG. 7(D).

Figure 7D:
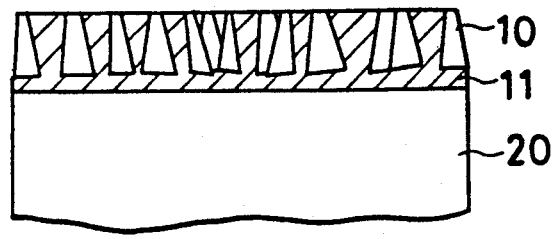

As easily understood from FIG. 7(D), the contact areas of the diamond crystals 10 and the surface of the object 20 are substantially increased by this procedure and the respective diamond crystals are fixed by the adhesive 11 which is not degraded even at high temperatures.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

Figure 8A:
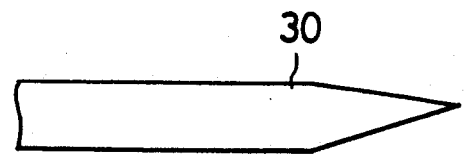
FIGS. 8(A) and 8(B) are explanatory views showing a modification of the first embodiment of the present invention.
Figure 8B:
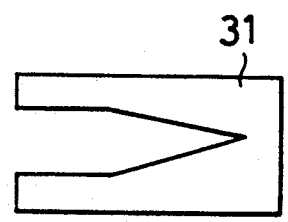
Figure 9A:
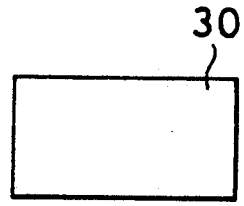
FIGS. 9(A) and 9(B) are explanatory views showing another modification of the second embodiment of the present invention.
Figure 9B:
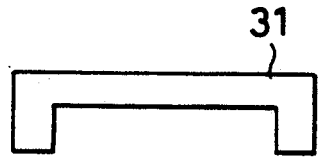

For example, a variety of objects can be coated in the same manner by preparing the substrate 1 as a mold which has a surface conforming to the surface of the object to be coated. FIGS. 8(A) and 8(B) illustrate an example of this modification. FIG. 8(A) shows, as an object to be coated, a cylinder 30 having a sharpened tip. For coating of such an object, a substrate 31 shown in FIG. 8(B) is used to provide an inner surface corresponding to the outer surface of the object 30. The inner surface is first coated with diamond coating followed by the same procedure as explained above with reference to FIGS. 3(A) to 3(E). FIGS. 9(A) and 9(B) illustrate another example of this modification. FIG. 9(A) shows, as an object to be coated, a rectangular block 30 having an upper surface to be reinforced. For coating of such an object, a substrate 31 shown in FIG. 9(B) is used to provide an inner surface corresponding to the upper surface of the object 30 followed by the procedure as shown in FIGS. 7(A) to 7(D).

The deposition method in the apparatus shown in FIG. 2 as described above is very appropriate because even if the objects have complicated surfaces, uniform diamond coatings can be deposited by this method. On the other hand, the etching of carbon material other than diamond can be appropriately carried out by means of other type of etching devices or chemical etching such as wet etching. The etching in the method of the second embodiment is preferably carried out in the same chamber as the deposition because the diamond coating can be kept clean without exposure to external atmosphere. The elimination of the unnecessary substrate 1 can be done also by use of suitable chemicals (solvent) capable of dissolving the substrate.

Carbon in the form other than diamond structure may be eliminated from the diamond coating of the present invention by heating the diamond coating in the apparatus shown in FIG. 2 at a reduced pressure instead of etching.

What is claimed is:

1. A coated article comprising:
   an article having at least one surface; and
   an industrial diamond coating provided on said surface where said coating comprises a number of CVD formed diamond crystals wherein spaces between the crystals are filled with a heat resistant, adhesive material which joins the diamond crystals to said one surface, said article formed by the steps comprising:
   forming said diamond crystals by CVD on a temporary substrate;
   attaching said substrate having said diamond crystals to said surface of the article using said adhesive material;
   removing said substrate from said article in order that said diamond crystals remain on said surface of the article;
   eliminating carbon in forms other than said diamond crystals from (a) the surface of said temporary substrate prior to the attachment of the substrate to the surface of the article or (b) the surface of said article after the removal of said substrate from the article; and
   filling void spaces occurring on the surface of said article with said adhesive material to form said industrial diamond coating.

2. A coated article as in claim 1 where said one surface is a working surface of a machine tool.

3. A coated article as in claim 1 where said diamond crystals are substantially conical in shape where the bases of the conical shaped crystals substantially face toward said one surface.

4. A coated article as in claim 1 where said heat-resistant, adhesive material is selected from the group consisting of polybenzimidazole, epoxy/phenolic, and nitride/phenolic.

* * * * *